(12) United States Patent
Lee et al.

(10) Patent No.: US 7,112,862 B2
(45) Date of Patent: Sep. 26, 2006

(54) LIGHT EMITTING AND/OR DETECTING DEVICE AND METHOD OF MANUFACTURING THE SAME

(75) Inventors: Eun-kyung Lee, Gyeonggi-do (KR); Byoung-lyong Choi, Seoul (KR); Jun-young Kim, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 57 days.

(21) Appl. No.: 10/965,203

(22) Filed: Oct. 15, 2004

(65) Prior Publication Data

US 2005/0082549 A1    Apr. 21, 2005

(30) Foreign Application Priority Data

Oct. 21, 2003    (KR)    ...................... 10-2003-0073443

(51) Int. Cl.
*H01L 31/00*    (2006.01)
(52) U.S. Cl. .................. 257/431; 257/79; 257/428; 257/E33.001; 438/22; 438/57; 438/48; 438/54; 438/69
(58) Field of Classification Search .................... None
See application file for complete search history.

(56) References Cited

U.S. PATENT DOCUMENTS 4,684,964 A * 8/1987 Pankove et al. ............... 257/86
6,872,624 B1 * 3/2005 Odake et al. ................ 438/264
6,875,670 B1 * 4/2005 Lee et al. .................... 438/435

FOREIGN PATENT DOCUMENTS

| JP | 2000-195811 | 7/2000 |
|---|---|---|
| KR | 1998-0006469 | 3/1999 |
| WO | 03/067670 A1 | 8/2003 |

OTHER PUBLICATIONS

Korean Office Action dated Aug. 30, 2005.

* cited by examiner

*Primary Examiner*—Nathan J. Flynn
*Assistant Examiner*—Scott R. Wilson
(74) *Attorney, Agent, or Firm*—Buchanan Ingersoll & Rooney PC

(57) ABSTRACT

A light emitting and detecting device and a method of manufacturing the same are provided. The method includes forming an insulating layer on a substrate doped with an n-type dopant or a p-type dopant, and removing a portion of the insulating layer to expose a predetermined area of the substrate; forming a doping layer doped with an opposite dopant to the dopant of the substrate by applying a dopant on the exposed area of the substrate and heat treating the substrate to create a light conversion effect in a p-n junction between the substrate and the doping layer; and forming first and second electrodes on the substrate to electrically connect the doping layer. Thus, it is possible to control the diffusion depth of the doping layer with opposite dopant to the substrate in the substrate.

14 Claims, 4 Drawing Sheets

LIGHT EMITTING AND/OR DETECTING DEVICE AND METHOD OF MANUFACTURING THE SAME

This application claims the priority of Korean Patent Application No. 2003-73443, filed on Oct. 21, 2003, in the Korean Intellectual Property Office, the disclosure of which is incorporated herein in its entirety by reference.

BACKGROUND OF THE INVENTION

1. Field of the Invention

The present invention relates to a light emitting and/or detecting device and a method of manufacturing the same, and more particularly, to a light emitting and/or detecting device that has a quantum structure and a microcavity formed by diffusion of dopant and oxidation of substrate surface, and a method of manufacturing the same.

2. Description of the Related Art

A logic element, a computing element, and a drive element can be integrated with high density and high reliability on a silicon substrate because silicon is cheap and the integration procedure to materialize a high integrated circuit is much cheaper than that for a compound semiconductor. Thus, most integrated circuits use silicon (Si) as a base material.

Numerous research studies are being carried out on the possibility to manufacture silicon-based light emitting diodes to embody low-priced photoelectron devices. It is experimentally proved that porous silicon and nano-crystal silicon have good light emitting characteristics and research on using these material for the above purposes is currently in progress.

FIG. 1 is a cross-section of a conventional light emitting and detecting device as illustrated in International Publication No. WO 03/067670. Referring to FIG. 1, a conventional light emitting and/or detecting device includes a substrate 11, a doping layer 15 formed on one surface of the substrate 11, and first and second electrodes 17 and 19, respectively, which are electrically connected on the doping layer 15 and formed on the substrate 11. When the doping layer 15 is formed, it is formed using a mask, and a control layer 13 that makes the doping layer 15 ultra-shallow can be further included on one surface of the substrate 11. After the doping layer 15 is formed, the control layer 13 can be selectively removed. The substrate 11 is made of a predetermined amount of semiconductor materials including silicon (Si), for example, Si, SiC, or diamond, and is doped with an n-type dopant or a p-type dopant.

The doping layer 15 is doped with an opposite dopant type to the substrate 11 by injecting a predetermined amount of dopant, for example, boron or phosphorous, to the substrate 11 through an opening of the control layer 13. Meanwhile, the boarder of the doping layer 15 and the substrate 11, i.e. a p-n junction 14, is formed as a quantum well, and in order to show a photoelectric conversion effect by a quantum restriction effect, the doping layer 15 is doped to a wanted ultra-shallow depth. The depth of the doping layer 15 in an ideal light emitting and detecting device is in the range of tens of nanometers.

In order to form the doping layer 15 with such doping depth, an ion implantation process is normally used. Thereafter, a heat treatment process is carried out to induce recrystallization, and to make the dopant injected at this stage diffuse deeply within the substrate 11 to control the doping depth. However, it is difficult to control the doping depth.

To solve the above-mentioned problem, a method of diffusing a dopant into the inner substrate is used in which a thin layer that includes the dopant or the dopant as a thin layer is mounted on a substrate and then a heat treatment is carried out. Layers such as a boro-silicate glass (BSG) layer, a boron silicide or a boron layer can be used as the thin layer. However, in this case, the dopant (boron) is quickly diffused into the substrate to a depth more than 100 nm during the heat treatment process. Even in a ten-minute heat treatment, the dopant is diffused into the substrate to a depth more than 300 nm. Therefore, it is hard to control the speed of the diffusion of a dopant even in a process of manufacturing a light emitting and detecting device by using a diffusion layer.

SUMMARY OF THE INVENTION

The present invention provides a method of manufacturing a light emitting and/or detecting device by controlling a depth of a doping region to a predetermined depth.

According to an aspect of the present invention, there is provided a method of manufacturing a light emitting and/or detecting device, the method including forming an insulating layer on a substrate doped with one of an n-type dopant and a p-type dopant, and removing a portion of the insulating layer to expose a predetermined area of the substrate; forming a doping layer doped with an opposite type dopant to the dopant of the substrate by applying the dopant on the exposed area of the substrate and undergoing a heat treatment to create a light conversion effect at a p-n junction of the substrate; and forming first and second electrodes on the substrate to electrically connect the doping layer.

The substrate includes at least one of Si, SiC, and diamond.

The forming of the insulating layer includes forming the insulating layer by oxidation of surface of the substrate; applying a photoresister on the insulating layer; and removing a portion of the insulating layer by placing a mask on top of the insulating layer and exposing, developing, and etching the insulating layer.

The forming of the doping layer includes applying a dopant material on the exposed surface of the substrate and the insulating layer such that the substrate becomes conductive; and diffusing the dopant material into the substrate by a heat treatment.

The dopant material may include at least one of boron and phosphorus.

According to another aspect of the present invention, there is provided a light emitting and/or detecting device, the device including a substrate doped with an n-type dopant or a p-type dopant; an insulating layer formed on top of the substrate, and a portion of which is removed to expose a portion of the substrate; a doping layer formed by diffusion of a dopant applied on the exposed portion of the substrate where the insulating layer is formed, and is doped with an opposite dopant to the substrate to create a light conversion effect at a p-n junction of the substrate; and first and second electrodes electrically connected to the doping layer, and formed on the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. FIGS. 2A through 2G are views to show a method of manufacturing a light emitting and/or detecting device according to the present invention.

Figure 1:
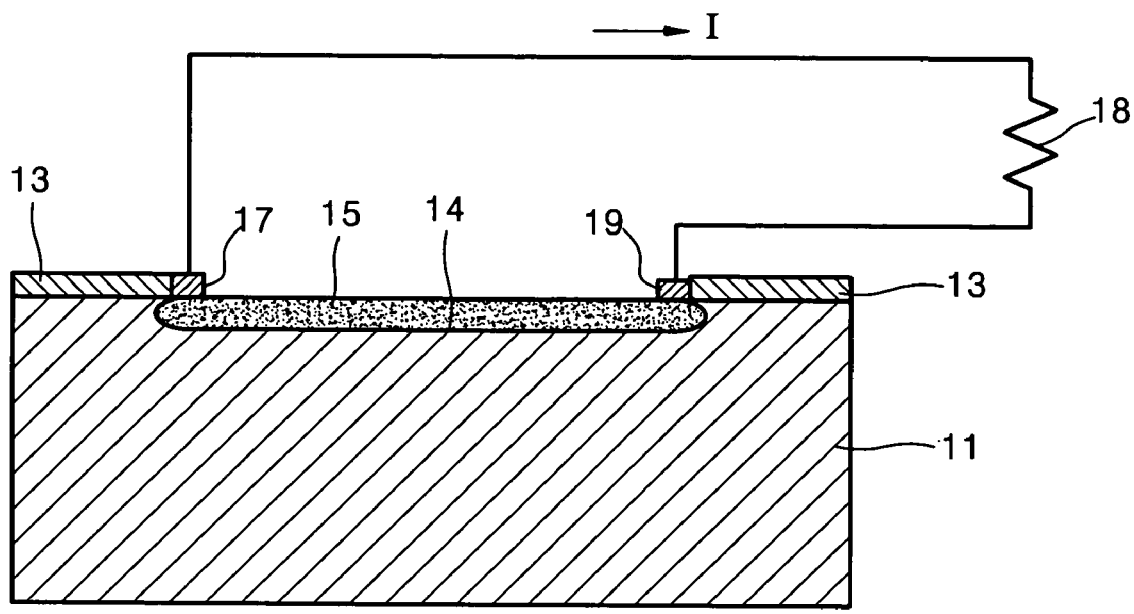
FIG. 1 is a cross-section of a conventional light emitting and/or detecting device.
Figure 2A:
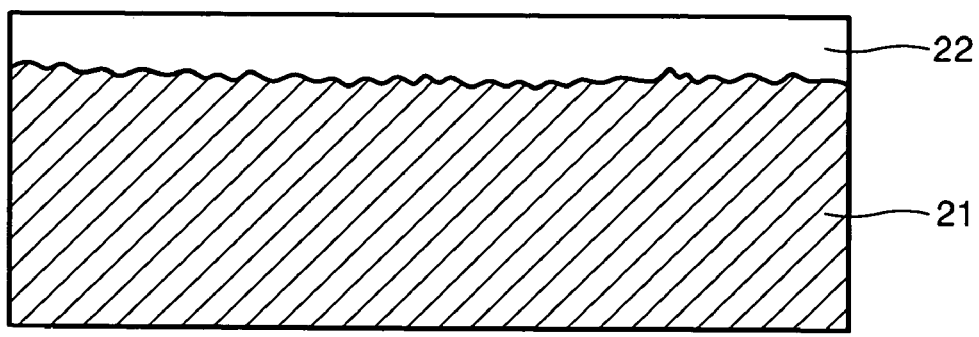
FIGS. 2A through 2G are views to show a method of manufacturing a light emitting and/or detecting device according to the present invention.

Referring to FIG. 2A, an insulating layer 22 is formed on a substrate 21 first. The substrate 21 is a semiconductor material that includes silicon such as Si or SiC, or a diamond and so on. The substrate 21 is, for example, doped with an n-type dopant. Then, layers such as $SiO_2$ oxidation layers are formed on the surface of the substrate 21 by oxidating the surface of the substrate 21. The insulating layer 22 is formed on the surface of the substrate 21 by such process.

Figure 2B:
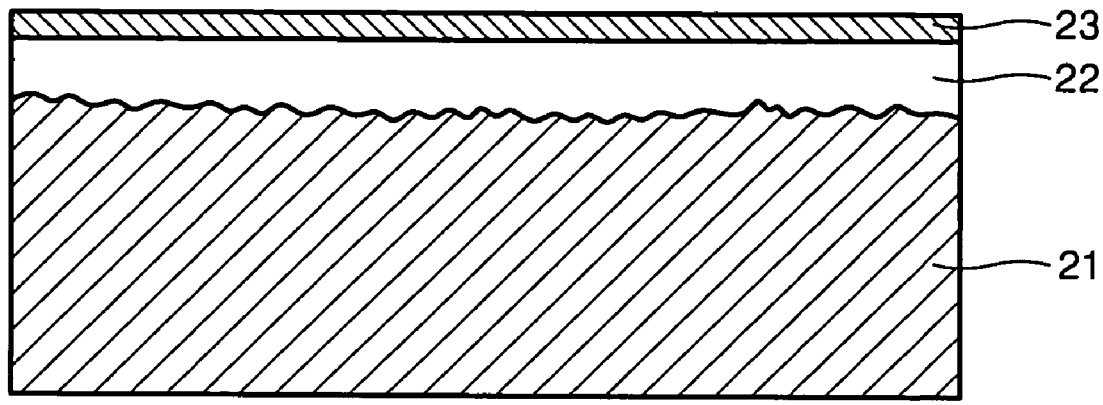
Figure 2C:
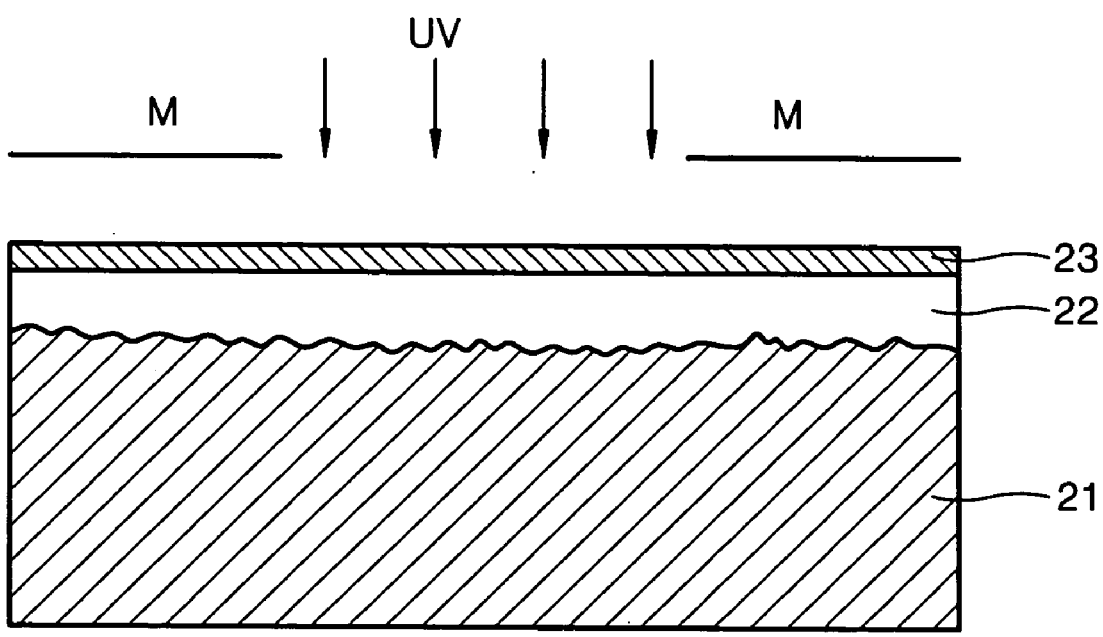
Figure 2D:
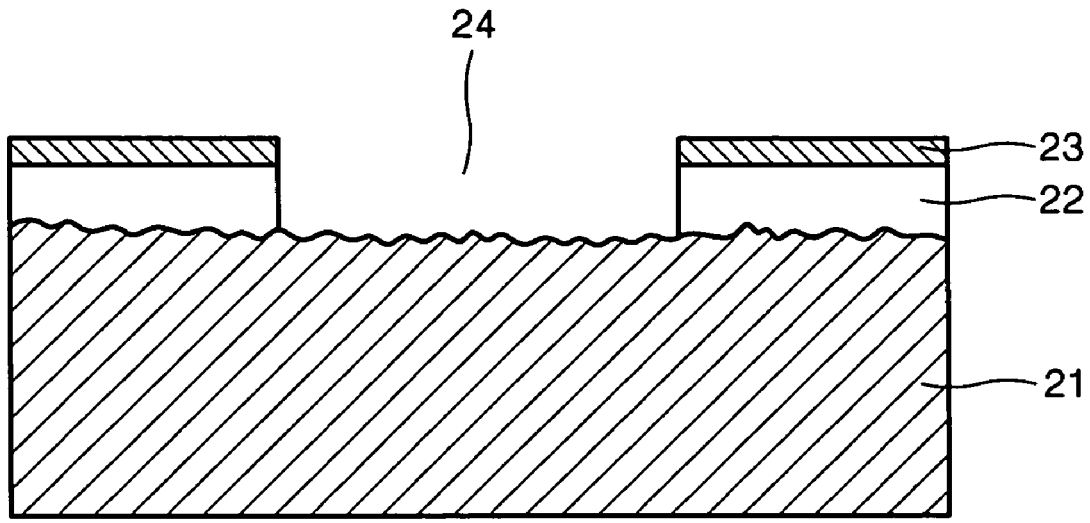

Next, the surface of the substrate 21 is exposed in a region corresponding to an area where a doping layer will be formed. In other words, as shown in FIG. 2B, a photoresist (PR) 23 is applied on the insulating layer 22. Then, as shown in FIG. 2C, a mask M is placed on top of the PR 23 and a portion of the PR 23 that corresponds to a region where the doping layer will be formed is exposed with ultraviolet rays UV, for example. When the insulating layer 22 and the PR 23 are etched after going through the exposing and developing processes, the surface of the substrate 21 of an exposed portion 24 where the doping layer is to be formed is created (FIG. 2D).

Figure 2E:
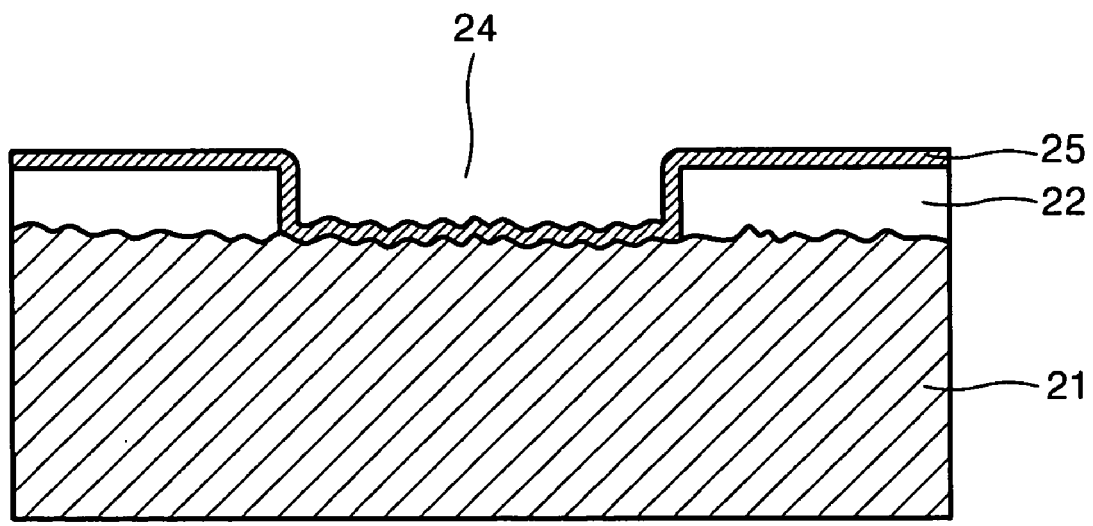

Afterwards, as shown in FIG. 2E, the PR 23 is removed from the top of the insulating layer 22, and a material layer 25 that is used as a dopant is formed on the insulating layer 22 and the exposed portion 24 of the substrate 21. The dopant material layer 25 can be composed of boron or phosphorus. For example, the material layer 25 can be formed as a thin layer such as a boro-silicate glass (BSG) layer, a boron silicide or a boron layer. In addition, after forming the material layer 25, the dopant diffuses into the substrate 21 by a heat treatment. Here, the heat treatment is carried out at a temperature higher than about 400 degrees Celsius and may be higher than about 500 degrees Celsius.

Figure 2F:
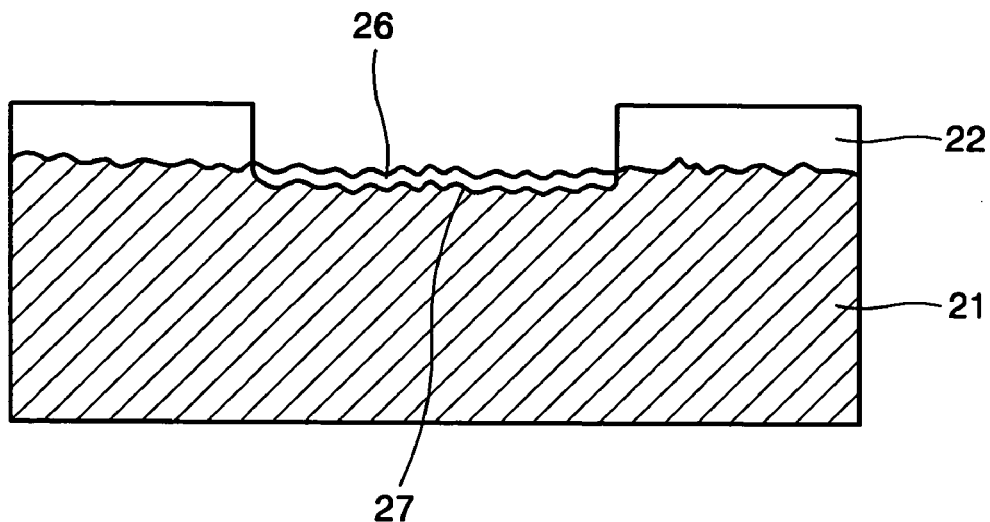

Through the diffusion, a doping layer 26 that is conductive is formed to a predetermined depth at the bottom of the exposed surface of the substrate 21, as illustrated in FIG. 2F. The doping layer 26 is doped with an opposite dopant from the substrate 21. If the substrate is doped with an n-type dopant, then the doping layer 26 is doped with a p-type dopant.

Here, the exposed portion 24 of the substrate 21 on which the doping layer 26 is formed is where the insulating layer 23 was initially formed. An oxidation layer such as $SiO_2$ existed in the insulating layer 23 on top of the substrate 21 as in shown FIG. 2A, and a mechanism that made diffusion into the substrate possible, i.e. amount of Si self interstitial site for an interstitial diffusion has decreased considerably. Here, a pre-treatment of a substrate can be carried out to decrease the amount of Si self interstitial site before diffusing the dopant.

In the present invention, the absolute amount of the Si self interstitial site needed for diffusion is significantly decreased in advance on the surface of the exposed region of the substrate 21 even when the exposed portion 24 of the insulating layer 22 is eliminated through etching as shown in FIG. 2D. Therefore, as shown in FIG. 2E, even when the dopant material layer 25 such as boron is heat treated not to make boron diffuse into the substrate 21, dopants exists only within an ultra thin depth of the substrate 21. In other words, it is possible to control the depth of a p-n junction 27 of the substrate 21 and the doping layer 26 in a range of approximately tens of nanometers.

In order to form the ultra-shallow doping layer 26 with a quantum structure on the substrate 21 and the p-n junction 27, the method of the present disclosure or an implantation process can be used. However, the implantation process is difficult since as previously mentioned, a doping layer 26 that may be from 10 to 20 nm deep needs to be formed in order to manufacture a light emitting and detecting device with an excellent quantum effect.

Here, the substrate 21 is doped with a p-type dopant, and it is possible for the doping layer 26 to be doped with an opposite dopant to the substrate 21, i.e., an n+type dopant.

As described above, if the doping process is controlled to form an ultra-shallow deep doping layer 26, a quantum structure composed of at least one of a quantum well, a quantum dot, and a quantum wire is formed at the border of the doping layer 26 and the substrate 21, i.e., the p-n junction 27, thereby creating a photoelectric conversion effect by a quantum restriction effect. In addition, a quantum structure composed of more than two of a quantum well, a quantum dot, and a quantum wire combined can be formed at the p-n junction 27. Since the quantum structure formed on the p-n junction 27 is well known, a detailed description of it will be omitted. The ultra-shallow doping that forms the quantum structure at the p-n junction 27 decreases the location of the interstitial diffusion caused by the formation of the oxidation layer, and can be created by controlling, for example, the condition of the diffusion process for forming the doping layer 26.

Figure 2G:
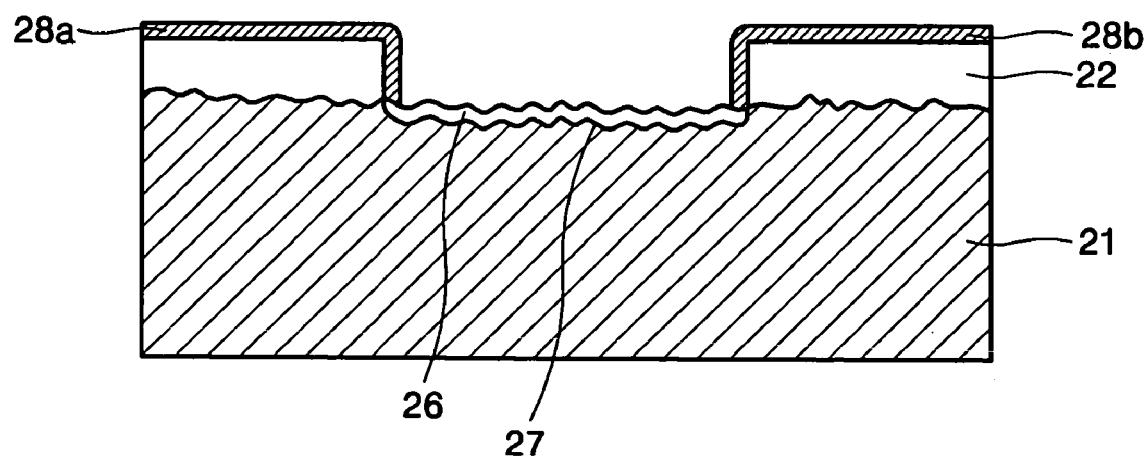

After forming the doping layer 26 as described above, in order to form electrodes as illustrated in FIG. 2G, conductive layers 28a and 28b are formed on top of the insulating layer 22 and the doping layer 26. Thus, a light emitting and detecting device as illustrated in FIG. 2G can be completed. The following is a description of the light emitting and detecting device of the present invention.

The light emitting and/or detecting device includes the substrate 21 doped with an n- or p-type dopant and the doping layer 26 formed on one side of the substrate 21 and doped with an opposite dopant to the substrate 21 so that a light conversion effect occurs at a p-n junction between the substrate 21 and the doping layer 26 are formed. First and second electrodes 28a and 28b are formed on the substrate 21 and are electrically connected to the doping layer 26. Also, when the doping layer 26 is formed, the doping layer 26 can be used as a mask, and the light emitting and detecting device can further have the insulating layer 22 to form the doping layer 26 in a wanted ultra-shallowness on one side of the substrate 21. Of course, the insulating layer 22 can be selectively removed after the doping layer 26 is formed.

The doping layer 26 is formed by applying a dopant and heat treating the substrate 21 after forming the insulating layer 22 thereon and then removing a portion of the insulating layer 22. In other words, the doping layer 26 injects a predetermined amount of dopant, for example, boron or phosphorus, within the substrate 21 by diffusion, thus doping the doping layer 26 in an opposite type to the substrate 21. The exposed portion 24 of the substrate 21 where the insulating layer 22 is removed limits the diffusion of the dopant as the amount of Si self interstitial decreased remarkably, thereby being able to form an ultra-shallow doping layer 26. The thickness of the doping layer 26 is in the range of tens of nanometers, preferably less than 100 nm, and preferably between 10 nm and 20 nm.

According to the present invention, a structure is provided that can block the diffusion of the dopant into a substrate by an insulating layer formed on the substrate before performing a doping process in a manufacturing process of a light emitting and detecting device. Thus, it is possible to control the depth of the doping layer in the range of tens of nanometers, and a high quantum efficiency can be achieved through a quantum restriction effect by a p-n junction.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing at least one of light emitting and detecting device, the method comprising:
   forming an insulating layer on a substrate doped with one of an n-type dopant and a p-type dopant, to decrease the amount of self interstitial site and removing a portion of the insulating layer to expose a predetermined area of the substrate;
   forming a doping layer doped with an opposite type dopant relative to the dopant of the substrate by applying a dopant on the exposed area of the substrate and heat treating the substrate to create a light conversion effect in a p-n junction between the substrate and the doping layer; and
   forming first and second electrodes on the substrate to electrically connect the doping layer.

2. The method of claim 1, wherein the substrate includes at least one of Si, SiC, and diamond.

3. The method of claim 2, wherein the forming of the insulating layer comprises:
   forming the insulating layer by oxidation of substrate surface;
   applying a photoresist on the insulating layer; and
   removing a portion of the insulating layer by placing a mask on top of the insulating layer and exposing, developing, and etching the insulating layer.

4. The method of claim 2, wherein the forming of the doping layer comprises:
   applying a dopant material on the exposed surface of the substrate and the insulating layer to make the substrate conductive; and
   diffusing the dopant material into the substrate by a heat treatment.

5. The method of claim 4 wherein the dopant material includes at least one of boron and phosphorus.

6. The method of claim 4 wherein the heat treatment temperature is higher than about 400 degree Celsius.

7. The method of claim 1, wherein the forming of the insulating layer comprises:
   forming the insulating layer by oxidation of substrate surface;
   applying a photoresist on the insulating layer; and
   removing a portion of the insulating layer by placing a mask on top of the insulating layer and exposing, developing, and etching the insulating layer.

8. The method of claim 1, wherein the forming of the doping layer comprises:
   applying a dopant material on the exposed surface of the substrate and the insulating layer to make the substrate conductive; and
   diffusing the dopant material into the substrate by a heat treatment.

9. The method of claim 8 wherein the dopant material includes at least one of boron and phosphorus.

10. The method of claim 8 wherein the heat treatment temperature is higher than about 400 degree Celsius.

11. A light emitting and/or detecting device, the device comprising:
   a substrate doped with one of an n-type dopant and a p-type dopant;
   an insulating layer formed on top of the substrate, and a portion of which is removed to expose a portion of the substrate;
   a doping layer formed by diffusion of a dopant applied on the exposed portion of the substrate where the insulating layer is formed, and doped with an opposite dopant type to the dopant of the substrate to create a light conversion effect in a p-n junction between the substrate and the doping layer; and
   first and second electrodes electrically connected to the doping layer, and formed on the substrate.

12. The device of claim 11, wherein the substrate includes at least one of Si, SiC, and diamond.

13. The device of claim 11, wherein the dopant material includes at least one of boron and phosphorus.

14. The device of claim 11, wherein the thickness of the doping layer is below 100 nm.

* * * * *